US 9,015,934 B2
(45) Date of Patent: Apr. 28, 2015

(12) United States Patent
Takeya

(10) Patent No.: US 9,015,934 B2

(54) METHOD FOR MANUFACTURING PROBE CARD

(75) Inventor: Toshinaga Takeya, Aomori (JP)

(73) Assignee: Kabushiki Kaisha Nihon Micronics, Musashino-shi, Tokyo (JP)

( * ) Notice: Subject to any disclaimer, the term of this patent is extended or adjusted under 35 U.S.C. 154(b) by 912 days.

(21) Appl. No.: 13/182,252

(22) Filed: Jul. 13, 2011

(65) Prior Publication Data

US 2012/0042516 A1 Feb. 23, 2012

(30) Foreign Application Priority Data

Aug. 19, 2010 (JP) ................................. 2010-183661

(51) Int. Cl.
H05K 3/30 (2006.01)
H05K 3/00 (2006.01)
G01R 31/00 (2006.01)
G01R 1/073 (2006.01)
G01R 3/00 (2006.01)

(52) U.S. Cl.
CPC ....... G01R 1/07357 (2013.01); Y10T 29/49165 (2015.01); G01R 3/00 (2013.01)

(58) Field of Classification Search
CPC ................... H05K 3/3447; H01L 2924/01079; G01R 1/07342; G01R 1/07378
USPC .......................... 29/837, 829, 832; 324/756.03
See application file for complete search history.

(56) References Cited

U.S. PATENT DOCUMENTS

| 3,952,410 | A | * | 4/1976 | Garretson et al. | ............... 29/834 |
| 4,623,839 | A | * | 11/1986 | Garretson et al. | ....... 324/750.25 |
| 5,066,907 | A | * | 11/1991 | Tarzwell et al. | ......... 324/750.25 |
| 5,309,327 | A | * | 5/1994 | Slater | ............................. 361/805 |
| 7,219,418 | B2 | * | 5/2007 | Byrd | ............................... 29/623 |
| 7,948,252 | B2 | * | 5/2011 | Grube et al. | ............. 324/754.07 |
| 8,310,259 | B2 | * | 11/2012 | Hamel et al. | ............. 324/756.03 |
| 8,373,428 | B2 | * | 2/2013 | Eldridge et al. | ......... 324/754.14 |
| 8,427,183 | B2 | * | 4/2013 | Mathieu et al. | ........... 324/750.16 |
| 8,485,418 | B2 | * | 7/2013 | Eldridge et al. | ............. 228/179.1 |
| 2005/0258847 | A1 | * | 11/2005 | Narazaki et al. | ............... 324/754 |

FOREIGN PATENT DOCUMENTS

| JP | 2009-162483 | | 7/2009 |
| JP | 2009162483 | * | 7/2009 |

* cited by examiner

Primary Examiner — David Angwin
(74) Attorney, Agent, or Firm — Ingrassia Fisher & Lorenz, P.C.

(57) ABSTRACT

A method for manufacturing a probe card prepares a plurality of probes, each having a metal layer on an attaching portion, and hot-melt material covering the metal layer. Each probe is attached to a probe substrate by inserting its attaching portion into a different through hole of the probe substrate so that at least a part of the metal layer is located in the through hole. The hot-melt material of each attaching portion is melted and thereafter solidified such that the hot-melt material contacts the metal layer and a part of a wall surface of the through hole, to fix each probe to the probe substrate.

7 Claims, 21 Drawing Sheets

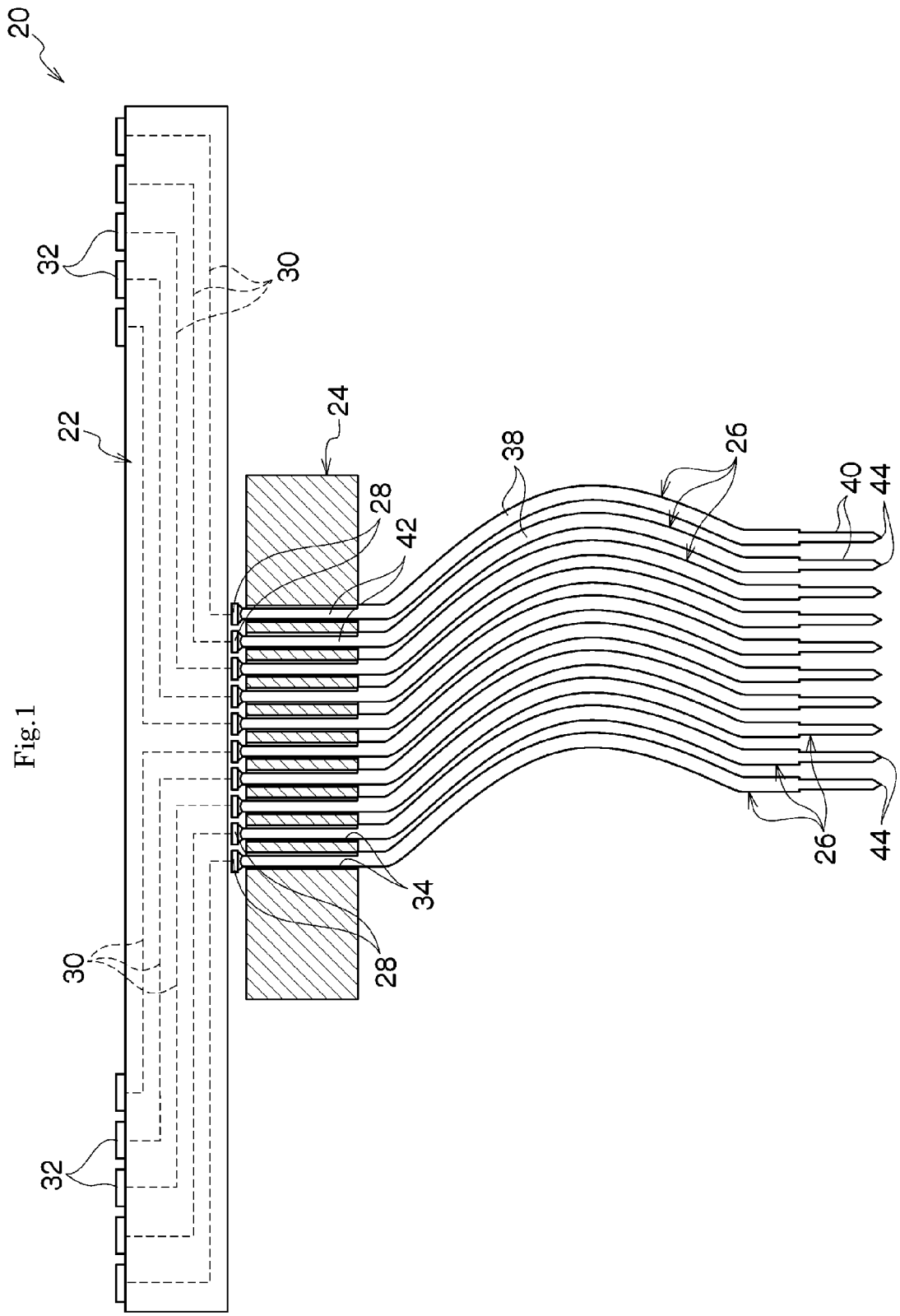

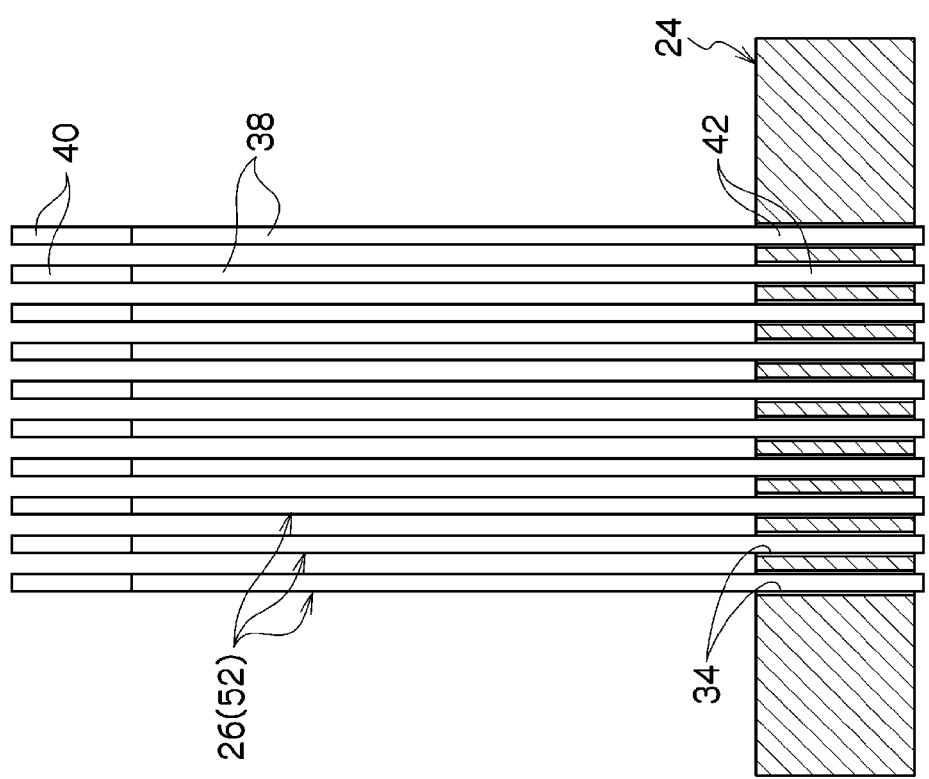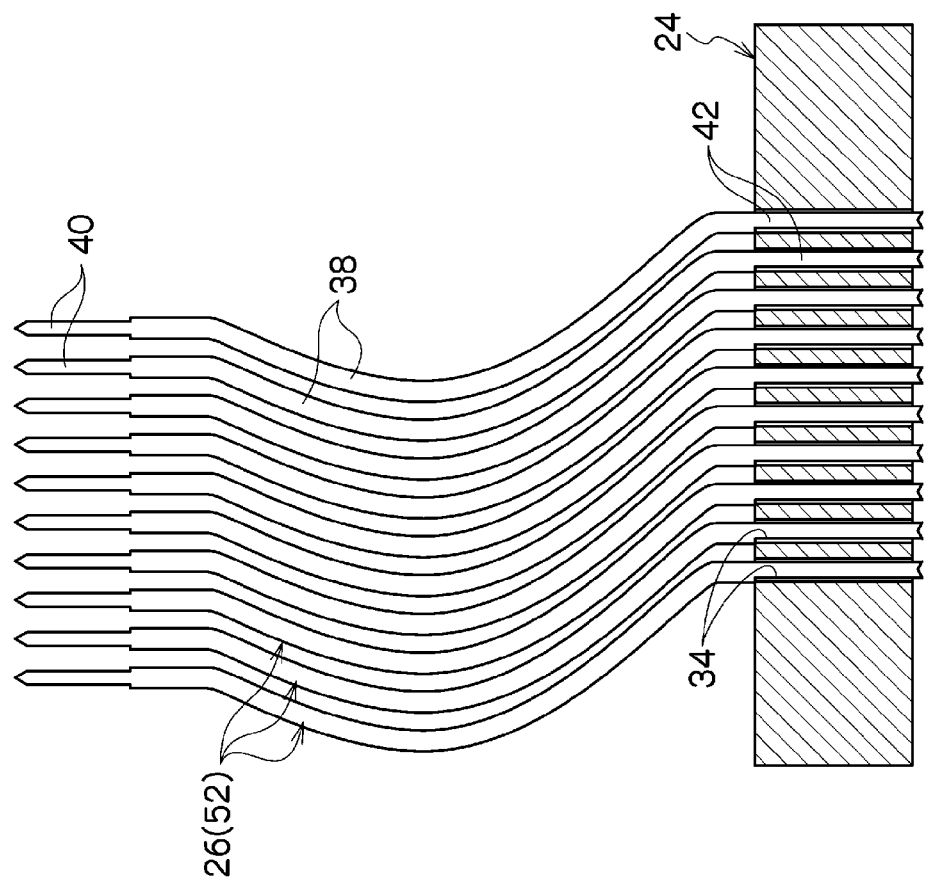

Fig.10(A)
Fig.10(B)
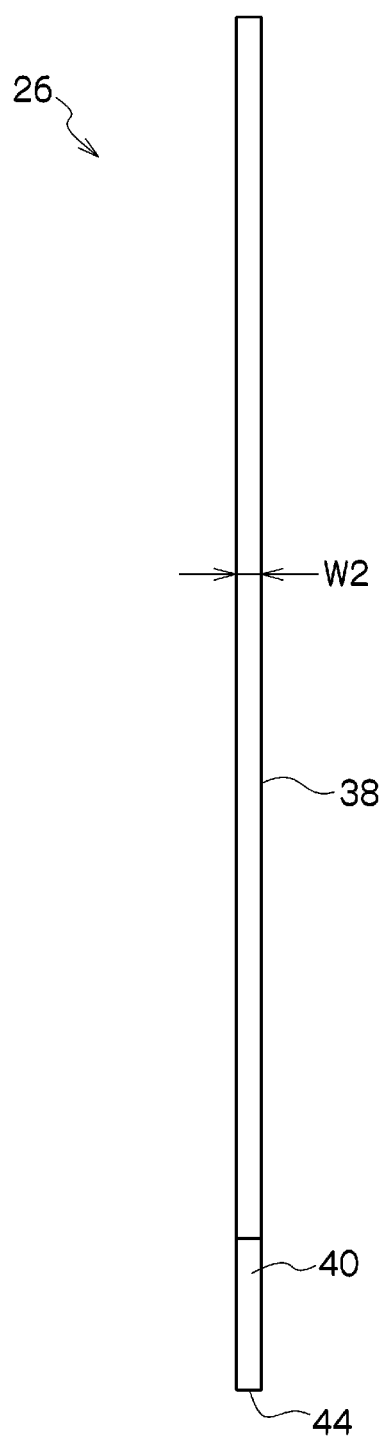
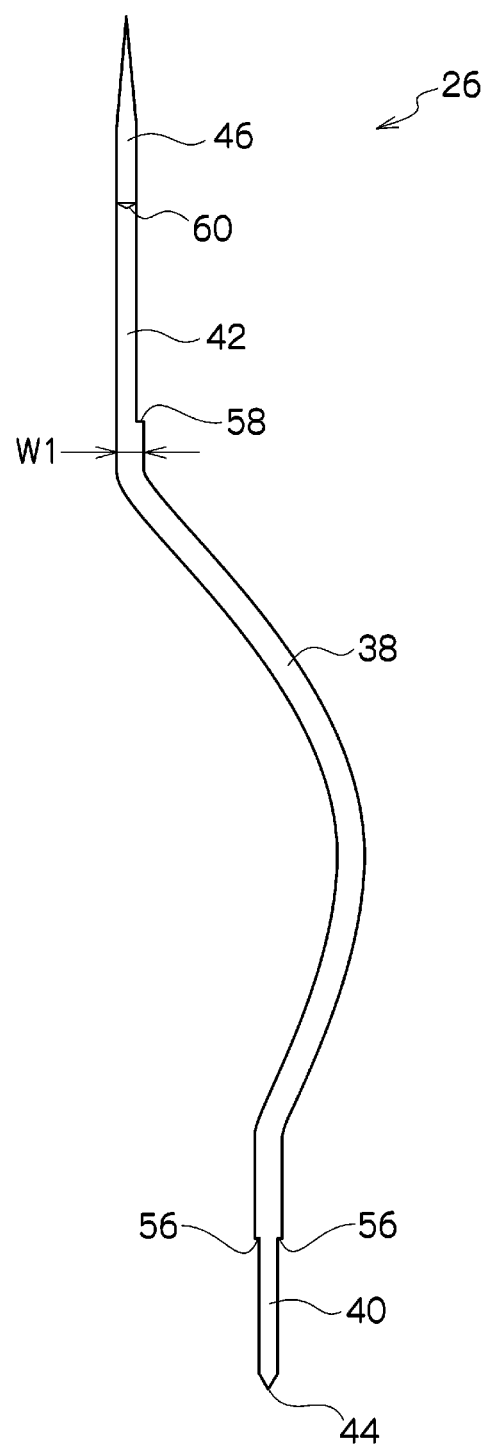

METHOD FOR MANUFACTURING PROBE CARD

PRIORITY CLAIM

The instant application claims priority to Japanese Patent Application No. 2010-183661, filed Aug. 19, 2010, which application is incorporated herein by reference in its entirely.

TECHNICAL FIELD

An embodiment of the subject matter relates to a method for manufacturing a probe card for use in an electrical test of a flat-plate-shaped device under test such as an integrated circuit.

BACKGROUND

Multiple integrated circuits formed on a semiconductor wafer undergo an inspection or a test to determine whether or not they have functions in accordance with the specification before being separated from the wafer. The multiple integrated circuits on one wafer are tested simultaneously at a time or in several batches. An example of a probe card to be used in a test of this kind is a vertical type with use of plural bar-like probes (Patent Document 1).

This known probe card includes a probe assembly having a supporting frame coupling an upper plate and a lower plate each having a plurality of through holes in a state of being spaced in an up-down direction and a plurality of probes passing through the through holes of the upper plate and the lower plate at their upper portions and lower portions. This probe assembly is attached to the lower side of a supporting substrate in a state where the probes extend downward.

An upper end of each probe is thrust on a connecting portion such as an end portion of a wire inserted in a through hole of the supporting substrate or a probe land provided on the lower surface of the supporting substrate and the supporting substrate. Also, as for each probe, its lower end portion is locked on the lower plate to be prevented from falling and passes through a through hole of the lower plate so as for a lower end (that is, a probe tip) to be positioned two-dimensionally. In this conventional art, the upper plate functions as a probe substrate while combination of the supporting frame and probes functions as a probe assembly.

However, in the above conventional probe card, since the upper end portion of each probe is just inserted in the through hole of the upper plate and is just thrust on the connecting portion on the supporting substrate, the upper end portion of each probe is unstable against the upper plate, the lower plate, and the supporting substrate due to looseness between the upper plate or lower plate and the probes. As a result, a relative position among the probe tips changes. Such a probe card cannot arrange the probes in a high-density manner.

CITATION LIST

Patent Document 1: Japanese Patent Appln. Public Disclosure No. 2009-162483

SUMMARY

It is an object of the embodiment of the subject matter to hold probes in a probe substrate easily and firmly for stable relative positional relationship among probe tips of the probes.

Basically in the embodiment of the subject matter, a method for manufacturing a probe card comprises a first step including preparing a probe having a probe tip portion and a columnar attaching portion having a circumferential surface, forming at a part of the circumferential surface a metal layer having higher wettability than that of the attaching portion, and forming a layer of a hot-melt material to cover the metal layer and at least a part of the circumferential surface exposed from the metal layer, a second step including preparing a probe substrate having a plurality of through holes penetrating in its thickness direction and inserting the attaching portion of each of the plurality of probes into each of the plurality of through holes of the probe substrate so that at least a part of the metal layer may be located in the through hole, and a third step of melting the hot-melt material of each attaching portion and thereafter solidifying the hot-melt material in a state where the hot-melt material contacts the part of the metal layer and a part of a wall surface of the through hole to fix each probe to the probe substrate.

A method for manufacturing a probe card according to the embodiment of the subject matter comprises a first step of manufacturing a plurality of bar-like probes, wherein each probe has a probe main body portion extending in an up-down direction, a probe tip portion extending downward from a lower end of the probe main body portion, an attaching portion extending upward from an upper end of the probe main body portion, a first metal layer provided on an outer circumferential surface of an upper area of the attaching portion, strip-like second metal layers respectively provided at two opposed surface areas of an area continuing downward from the upper area of the attaching portion and extending in a longitudinal direction of the attaching portion, and a conductive jointing material layer provided at the upper area and the two surface areas to cover the first and second metal layers, a second step including preparing a probe substrate having a plurality of through holes penetrating in its up-down direction and arrayed on the probe substrate at least in a row and inserting the attaching portion of each of the plurality of probes into the corresponding through hole, and a third step of melting a material for the jointing material layer and solidifying the molten material for the jointing material layer to fix the attaching portion of each probe in each through hole of the probe substrate. The first and second metal layers are made of a material in which wettability of the jointing material layer to the metal layers is higher than wettability of the jointing material layer to the attaching portion.

The attaching portion of each probe may have a rectangular cross-sectional shape, the two surface areas may reside on two side surfaces containing two opposed sides of the rectangle of the probe, and each of the second metal layers may have a smaller width dimension than that of the surface area at which each of the second metal layers is provided.

Each probe may have on its upper end surface an opening ranging from one side to the other side of the two side surfaces and have at least at a part of the upper end surface a third metal layer made of a material in which wettability of the jointing material layer to the third metal layer is higher than wettability of the jointing material layer to the attaching portion.

The first step may include manufacturing a probe plate, the probe plate may have the plurality of probes and a tab integrally coupling the probes and detachable from each probe at the proximity of the probe tip portion of each probe, and the method according to the embodiment of the subject matter may further comprise, after the third step, a fourth step of separating the tab from each probe.

Each probe may have a leading portion extending upward from an upper end portion of the attaching portion, inserting the attaching portion into the through hole may include inserting the attaching portion of each probe into the through hole from a side of the leading portion, and the method according to the embodiment of the subject matter may further comprise, after the second step, a fifth step of removing the leading portion from the probe.

The plurality of through holes may be arrayed in plural rows, the first step may include manufacturing a plurality of probe plates, each probe plate may have the plurality of probes and a tab collectively holding the probes and detachably coupled integrally with each probe at the proximity of the probe tip portion of each probe, and the method according to the embodiment of the subject matter may further comprise, after the third step, a sixth step of separating the tab from each probe.

The method according to the embodiment of the subject matter may further comprise a seventh step including arranging the probe substrate on one surface of a wiring board and jointing the upper end portions of the attaching portions to a plurality of coupling portions formed on the one surface of the wiring board.

The probe main body portion of each probe may have a curve bent or curved in an equal direction.

The first and second metal layers in which wettability of the material for the jointing material layer to the metal layers is higher than wettability of the jointing material layer to the attaching portion are respectively provided on the outer circumferential surface of the upper area of the attaching portion and at the two opposed surface areas of the area continuing into the upper area of the attaching portion, and the conductive jointing material layer is provided at the upper area and the two surface areas to cover the first and second metal layers. Thus, when the jointing material is melted, the jointing material is concentrated on the metal layers and is solidified to joint the attaching portion to the through hole firmly. As a result, it is possible to hold the probes in the probe substrate easily and firmly for stable relative positional relationship among the probe tips of the probes.

In a case where each probe has on its upper end surface the opening ranging from one side to the other side of the side surfaces forming the two opposed sides of the rectangle and has at a surface area forming the opening the third metal layer in which wettability of the jointing material layer to the metal layer is higher than wettability of the jointing material layer to the attaching portion, the jointing material is concentrated on the third metal layer when the end portion of the attaching portion of each probe is to be jointed to the coupling portion of the wiring board by the conductive jointing material. As a result, it is possible to joint the end portion of the attaching portion of each probe to the coupling portion of the wiring board easily and firmly.

In a case where the probe plate in which the plurality of probes are detachably coupled integrally and in parallel with the tab at the probe tip portions is manufactured, and then each probe is separated from the tab, an inserting operation of the attaching portions in the through holes becomes easy.

BRIEF DESCRIPTION OF DRAWINGS

FIG. 1 is a front view showing an embodiment of a probe card.

FIG. 7 (A) is a front view, and FIG. 7 (B) is a right side view, showing a state in which each probe has been separated from a tab.

FIG. 10 (A) is a left side view showing an embodiment of the probe used in the embodiment of the subject matter, and FIG. 10 (B) is a front view of the probe shown in FIG. 10 (A).

DETAILED DESCRIPTION

Figure 2A:
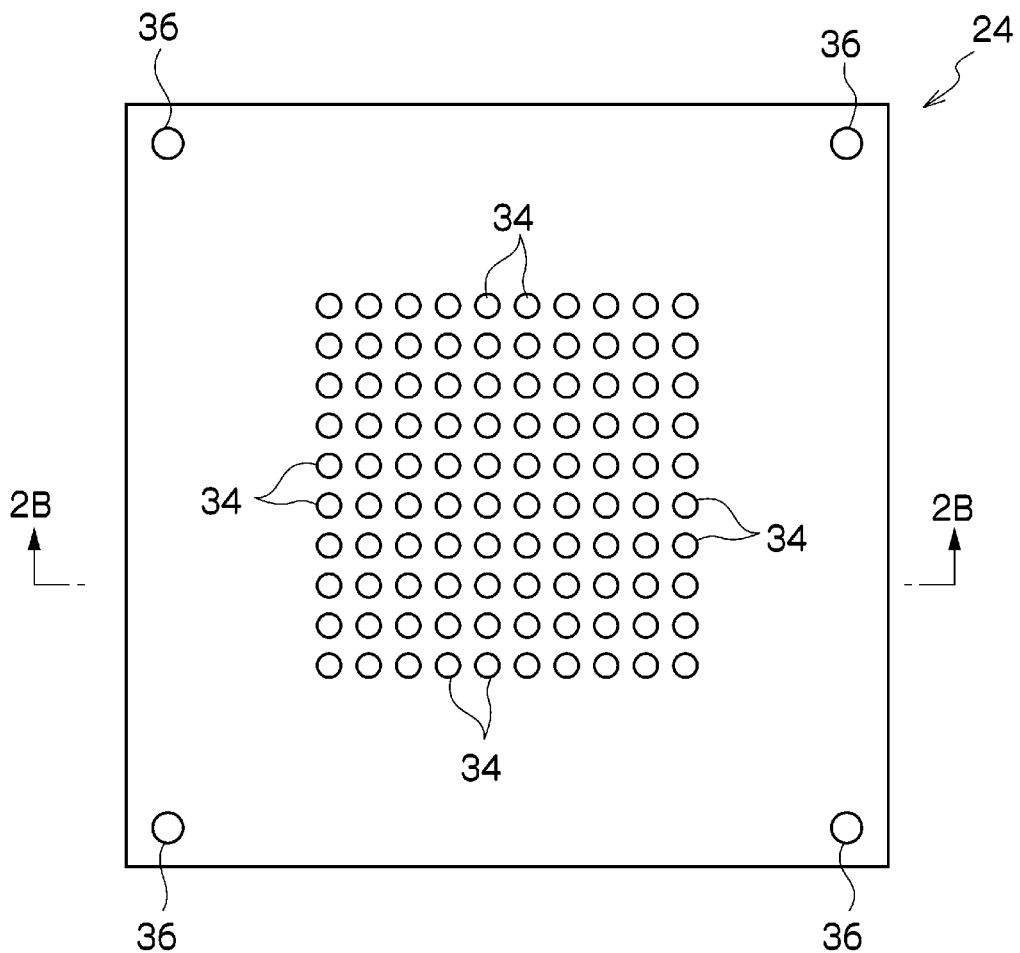
FIG. 2 (A) is a top view showing an embodiment of a probe substrate, and FIG. 2 (B) is a cross-sectional view obtained along the line 2B-2B in FIG. 2 (A).

In the embodiment of the subject matter, in FIG. 1, an up-down direction is referred to an up-down direction, a right-left direction is referred to as a right-left direction, and a direction perpendicular to the drawing sheet is referred to as a front-back direction. However, these directions differ with the posture of a device under test at the time of a test.

Accordingly, a probe card according to the embodiment of the subject matter may be used in any state such as a state in which a plane defined by the right-left direction and the front-back direction is a horizontal plane or a state in which it is inclined to a horizontal plane.

Embodiments

Referring to FIG. 1, a probe card 20 includes a wiring board 22, a probe substrate 24 arranged on the lower side of the wiring board 22, and multiple bar-like probes 26 arranged in the probe substrate 24 in a state of extending downward from the probe substrate 24.

The wiring board 22 is made of an electrical insulating material such as a glass-containing epoxy resin or a ceramic in a circular plate shape. The wiring board 22 has multiple conductive coupling portions 28 provided on the lower surface, multiple internal wires 30 each electrically connected to the coupling portion 28 at one end, and multiple connecting portions 32 provided on the upper surface.

The plural coupling portions 28 are arrayed on the wiring board 22 in plural rows, and each coupling portion 28 is in a land shape. The connecting portion 32 is a tester-land connected to an electric circuit of a tester in the example shown in the figure but may be a connector terminal.

Each internal wire 30 electrically connects the coupling portion 28 to the connecting portion 32. However, in a case where plural electronic components such as a capacitor, an IC relay, and an integrated circuit for a test are provided on the upper surface of the wiring board 22, some internal wires 30 connect the coupling portions 28 to the connecting portions 32, some internal wires 30 connect the coupling portions 28 to the electronic components, and the other internal wires 30 connect the connecting portions 32 to the electronic components.

Figure 2B:
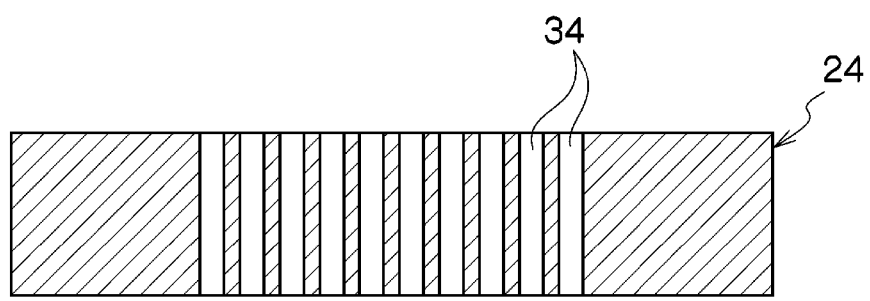

The probe substrate 24 is made of an electrical insulating material such as a ceramic in a rectangular plat plate shape, has at the central area multiple through holes 34 opened to the upper surface and lower surface and at the four corners through holes 36 respectively, as specifically shown in FIGS. 2 (A) and 2 (B). The multiple through holes 34 are arrayed on the probe substrate 24 in plural rows, and each through hole 34 receives an upper end portion of a corresponding probe 26. Each through hole 34 has a circular transverse cross-sectional shape.

Positioning pins (not shown) positioning the probe substrate 24 against the wiring board 22 can be inserted in a pair of through holes 36 located in one diagonal direction of a rectangular of the probe substrate 24. Bolts (not shown) attaching the probe substrate 24 to the wiring board 22 can be inserted in a pair of through holes 36 located in the other diagonal direction of the rectangular of the probe substrate 24. However, the positioning pins may be inserted in all of the through holes 36, and through holes in which the bolts are to be inserted may be provided at other locations.

Each probe 26 has a rectangular cross-sectional shape such as a prismatic column in the example shown in the figure. Each probe 26 has a probe main body portion 38 extending in the up-down direction, a probe tip portion 40 extending downward from the lower end of the probe main body portion 38, and an attaching portion 42 extending upward from the upper end of the probe main body portion 38. Each probe 26 has at the lower end a probe tip 44 to be thrust on an electrode of a device under test.

Each probe 26 is inserted in the through hole 34 of the probe substrate 24 at the attaching portion 42 in a state where the probe main body portion 38 and the probe tip portion 40 extend in the up-down direction from the probe substrate 24 and in a state where the upper end portion of the attaching portion 42 is slightly projected upward from the probe substrate 24, is fixed at the wall portion forming the through hole 34 by a conductive jointing material or a hot-melt material (not shown), and is jointed at the upper end portion to the coupling portion 28 of the wiring board 22 by a conductive jointing material (not shown).

The probe main body portion 38 of each probe 26 is curved in the same direction. Each probe 26 is manufactured by a photolithographic technique in which exposure and etching are performed with use of a photoresist and a deposition technique such as electroforming and sputtering in which a metal material such as a nickel alloy represented by a nickel-boron alloy or a nickel-phosphorus alloy or nickel is deposited in a recess formed by the photolithographic technique.

The shape and structure of the probe 26 and the relationship between the wiring board 22 or the probe substrate 24 and the probes 26 will be described later in details.

Figure 3:
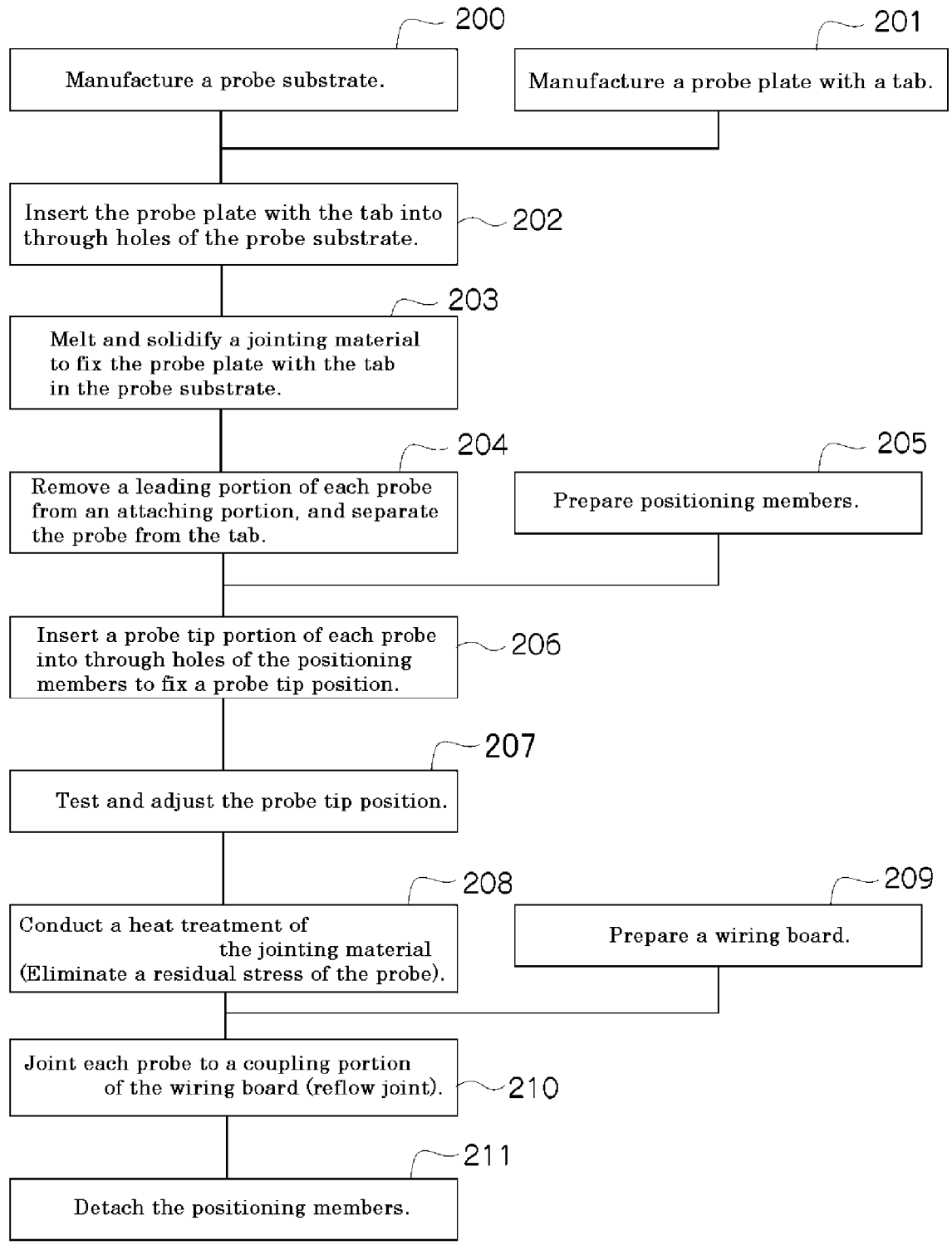
FIG. 3 is a flowchart illustrating a manufacturing method according to the embodiment of the subject matter.

Referring to FIG. 3, a method for manufacturing the above probe card will be described below.

Figure 4:
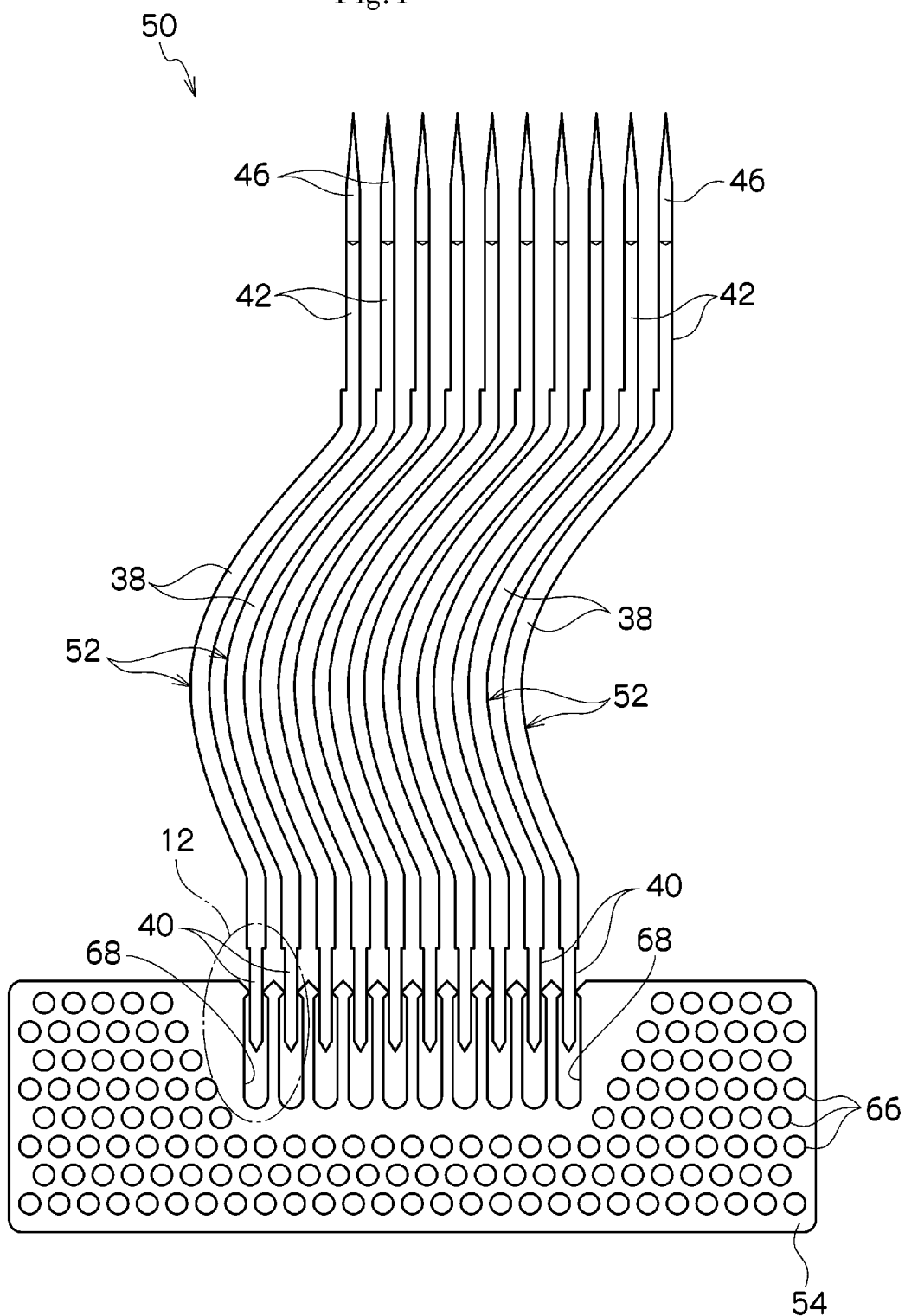
FIG. 4 is a front view showing an embodiment of a probe plate used in the embodiment of the subject matter.

First, the probe substrate 24 shown in FIG. 2 and plural probe plates 50 with tabs shown in FIG. 4 are manufactured (steps 200 and 201). The probe substrate 24 can be obtained by forming the through holes 34 and 36 on a ceramic plate by a laser process or a drilling process.

Figure 11:
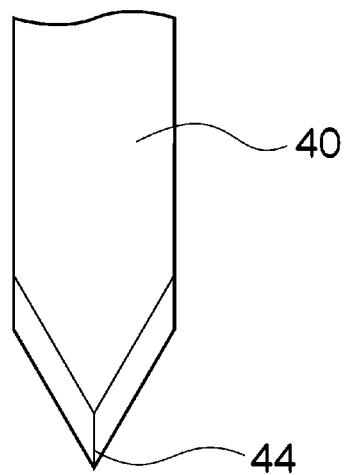
FIG. 11 is an enlarged perspective view showing the probe tip and its proximity.
Figure 12:
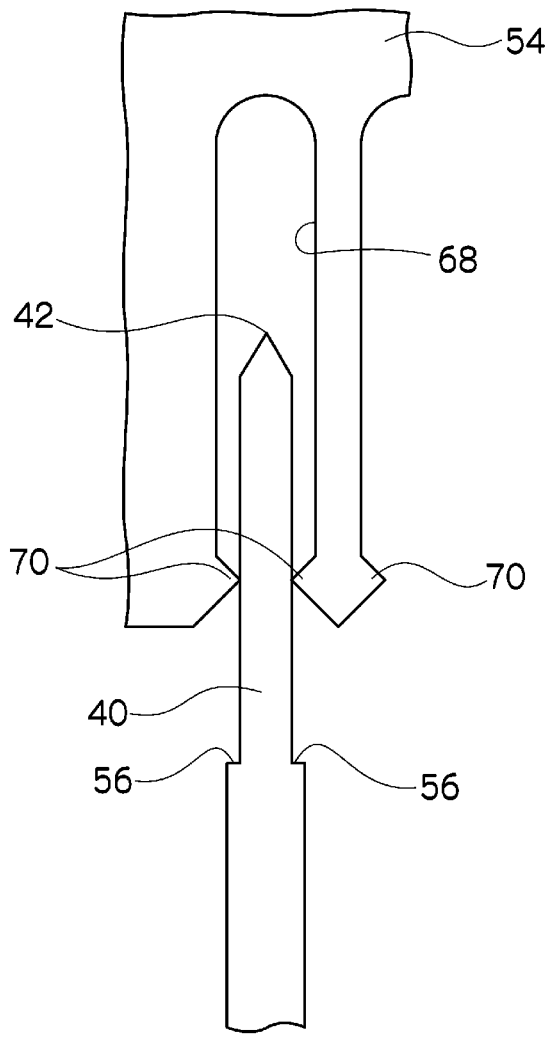
FIG. 12 is an enlarged view of the area 12 in FIG. 4.
Figure 13:
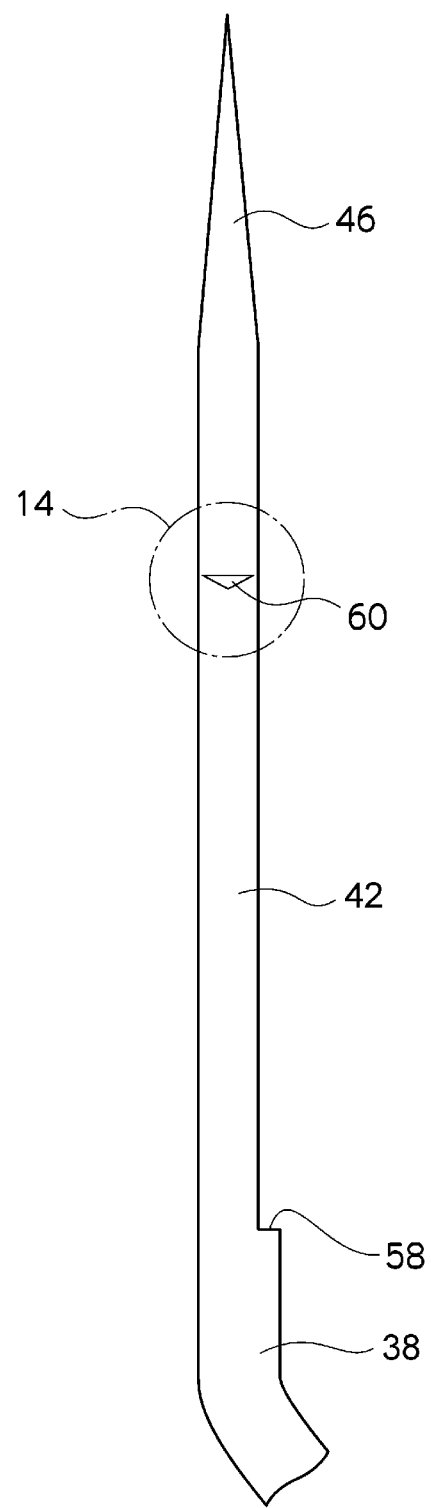
FIG. 13 is an enlarged view showing the attaching portion and the leading portion of the probe.

As shown in FIG. 4, each probe plate 50 includes plural probes 52 and a tap 54 putting the plural probes 52 together. The tab 54 is detachably coupled integrally with each probe 52 at the proximity of the probe tip 44 of each probe 52. As shown in FIGS. 10 to 12, each probe 52 has the probe main body portion 38 having a curved curve, the probe tip portion 40 continuing into the lower end of the probe main body portion 38 and having the probe tip 44 at the lower end, and the attaching portion 42 continuing into the upper end of the probe main body portion 38 in addition to a leading portion 46 continuing into the upper end of the attaching portion 42 and extending upward from the attaching portion 42.

The probe main body portion 38, the probe tip portion 40, the attaching portion 42, and the leading portion 46 are integrally made of a highly-resilient metal material such as a nickel alloy represented by a nickel-boron alloy or a nickel-phosphorus alloy or nickel. At least at the probe tip 44 is formed a highly hard metal film made of a metal material having higher hardness than those of materials for other portions such as the probe main body portion 38. Such a highly hard metal film can be formed by plating.

As specifically shown in FIGS. 10 to 15, the probe main body portion 38 has a rectangular cross-sectional shape. In the example shown in the figures, although a part of the probe main body portion 38 is curved in an arc to regard the curved portion as a curve, a part of the probe main body portion 38 may be bent in a lateral V shape to regard the bent portion as a curve. The probe main body portion 38 has a rectangular cross-sectional shape. Such a rectangle is shaped so that dimension (thickness dimension or width dimension) W1 in the right-left direction of the probe main body portion 38 may be equal or slightly larger than dimension W2 in the front-back direction, as shown in FIG. 10.

The probe tip portion 40 has an upper area having a rectangular cross-sectional shape in which a dimension corresponding to dimension W1 is smaller than a dimension corresponding to dimension W2 and a lower area in which a dimension corresponding to dimension W1 is decreased toward the side of the probe tip 44. Accordingly, downward steps 56 at a border between the probe main body portion 38 and the probe tip portion 40 are formed on one side and the other side in the right-left direction, respectively.

The attaching portion 42 has a rectangular cross-sectional shape in which a dimension corresponding to dimension W1 is smaller than a dimension corresponding to dimension W2. The attaching portion 42 is eccentrically located on one side in the right-left direction of the upper end portion of the probe main body portion 38. Accordingly, an upward step 58 at a border between the probe main body portion 38 and the attaching portion 42 is formed on one side in the right-left direction.

The leading portion 46 extends upward on the same axis as that of the attaching portion 42 and has a lower area having a rectangular cross-sectional shape that has the same size and the same shape as those of the attaching portion 42 and an upper area in which a dimension corresponding to dimension W1 is decreased toward the upper end side.

Each probe 26 also has on the upper end surface of the attaching portion 42 a recess or an opening 60 ranging from one side to the other side of two surface areas forming two opposed sides of a rectangle. A metal layer 62 is formed on an outer circumferential surface of an upper area of the attaching portion 42, on two opposed surface areas of an area continuing into the upper area, and on a surface area forming the opening 60. Further, a jointing material layer 64 is provided to cover exposed portions of three outer circumferential surfaces at the upper area of the attaching portion 42 and the metal layer 62 at the two opposed surface areas of the area continuing into the upper area.

Figure 14:
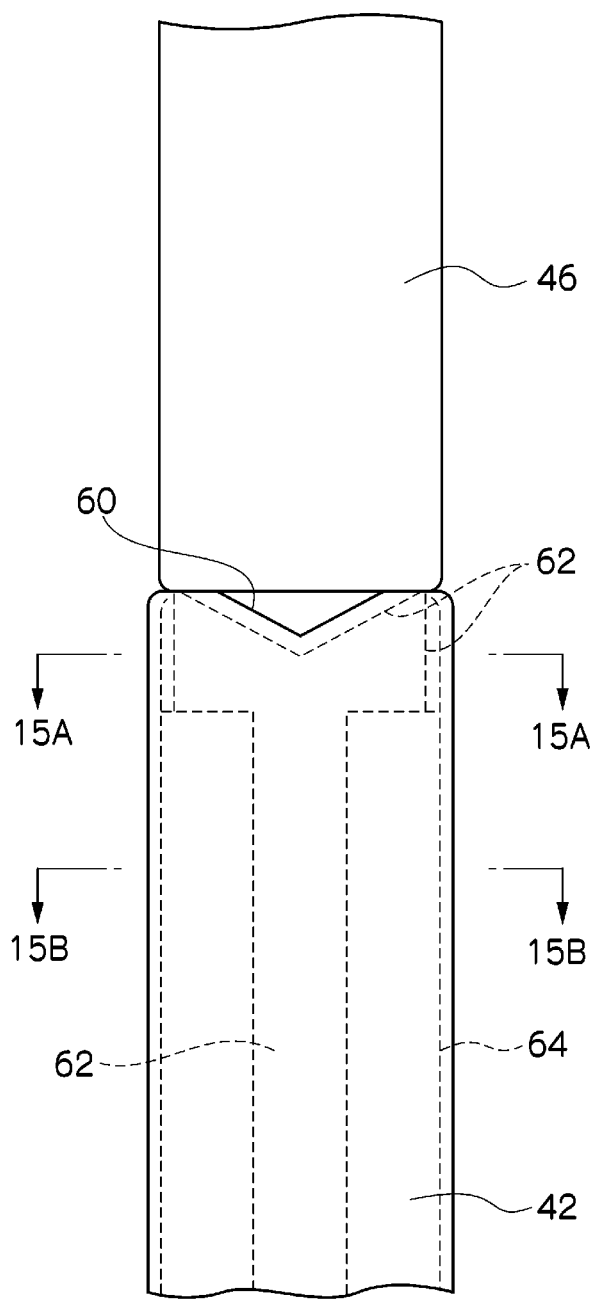
FIG. 14 is an enlarged view of the area 14 in FIG. 13.
Figure 15A:
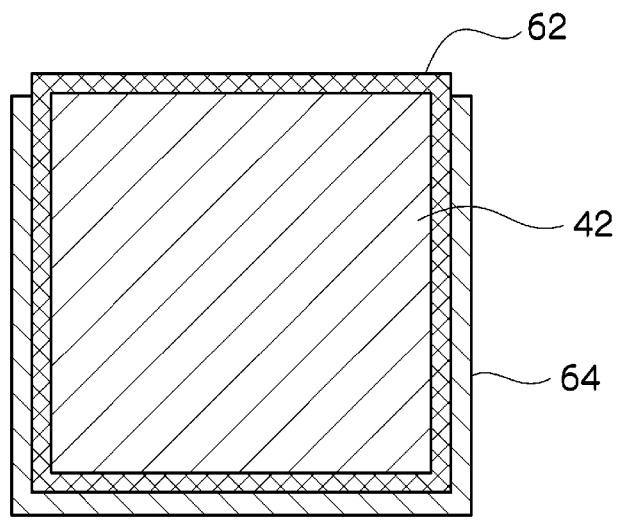
FIG. 15 (A) is an enlarged view obtained along the line 15A-15A in FIG. 14, and FIG. 15 (B) is an enlarged view obtained along the line 15B-15B in FIG. 14.
Figure 15B:
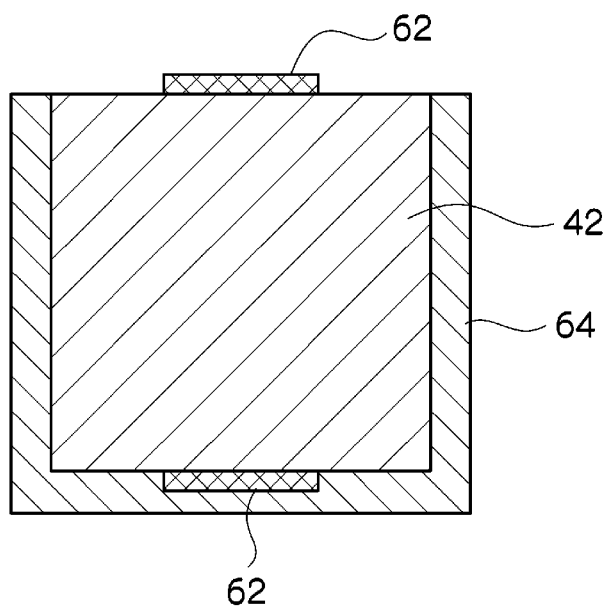

In the example shown in FIGS. 14 and 15, the metal layer 62 provided on the outer circumferential surface of the upper area of the attaching portion 42 is provided over the entirety in the circumferential direction of the upper area, and the metal layer 62 provided at the two surface areas is in a strip shape having a smaller width dimension than that of the surface area and extending along the entire area in the longitudinal direction of the attaching portion 42.

The metal layer 62 is made of a material in which wettability of the jointing material layer 64 to the metal layer 62 is higher than wettability of the jointing material layer 64 to the attaching portion 42. Also, the jointing material layer 64 is made of a metal material having a lower melting point than those of the attaching portion 42 and the metal layer 62. In a case where the attaching portion 42 is made of a nickel metal material such as nickel or a nickel alloy, a material for the metal layer 62 can be a gold or silver metal material such as gold, a gold alloy, silver, or a silver alloy, and a material for the jointing material layer 64 can be a tin metal material such as tin or a tin-lead alloy.

As shown in FIG. 4, the tab 54 is in a rectangular plate shape having the same thickness dimension as a thickness dimension of the probe 26 in the front-back direction and is made of the same metal material as those for the probe main body portion 38, the probe tip portion 40, and the leading portion 46 of the probe 26 to be integral with the probe 26. The tab 54 has multiple holes 66 penetrating in the thickness direction and has on one side of the rectangle multiple recesses 68 spaced in a direction of one side of the rectangle, as shown in FIG. 4. In each recess 68 is located the probe tip portion 40 of the probe 26.

As shown in FIG. 12, each recess 68 is formed in an Ω shape, and an entrance of each recess 68 is narrowed by two opposed projecting portions or coupling portions 70. Each coupling portion 70 is in a triangular shape and makes a tip end corresponding to the apex of the triangle opposed. The probe tip portion 40 is integrally coupled with the tip ends of the coupling portions 70.

The above probe plate 50 can be manufactured by the aforementioned photolithographic technique and deposition technique.

Figure 16:
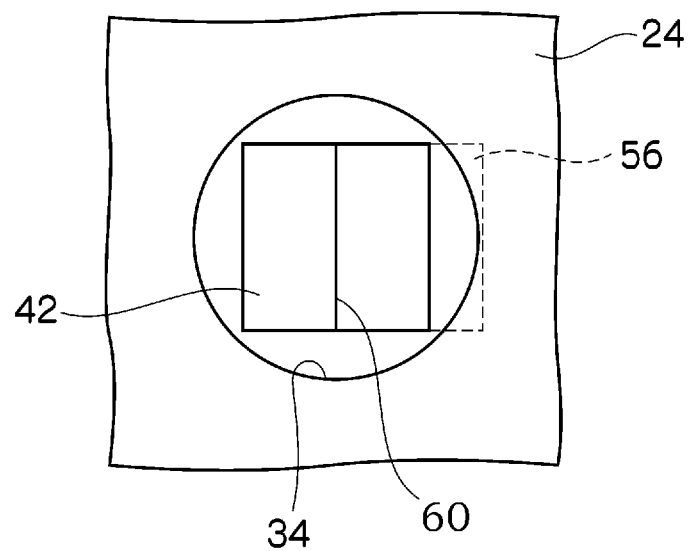
FIG. 16 is an enlarged view seen from a direction of the arrow 16 in FIG. 5.
Figure 17A:
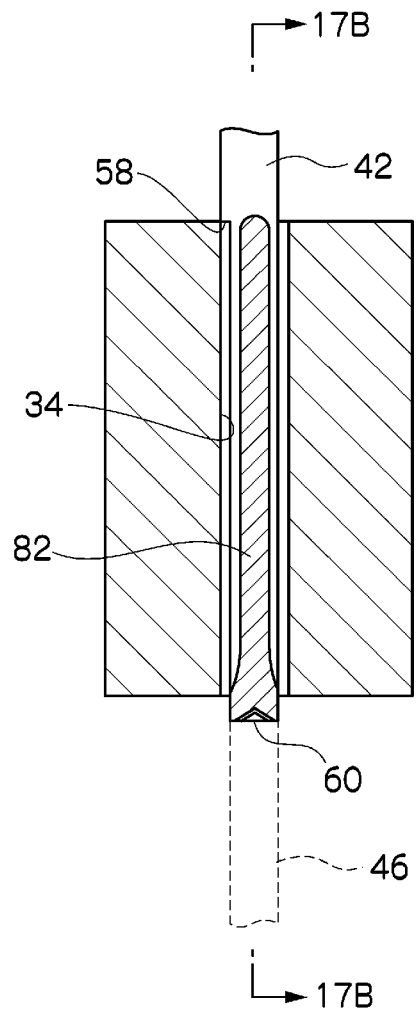
FIG. 17 (A) is a cross-sectional view showing an embodiment of a coupling state of the probe with the probe substrate, FIG. 17 (B) is a cross-sectional view obtained along the line 17B-17B in FIG. 17 (A), and FIG. 17 (C) is a view seen from the lower side of FIG. 17 (A) with parts of a jointing material hatched.
Figure 17B:
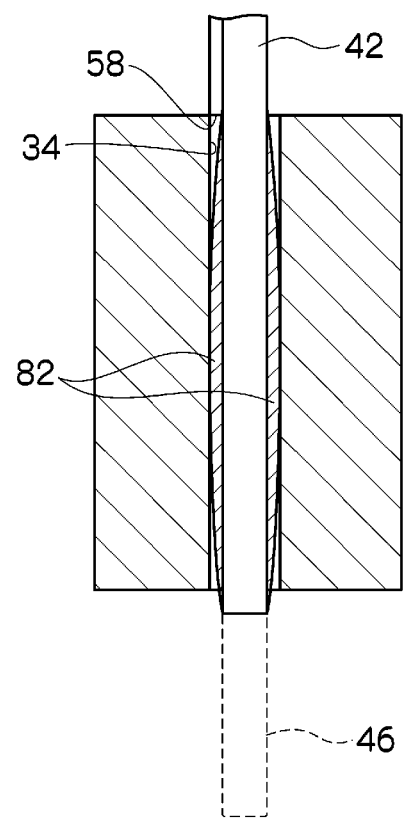
Figure 17C:
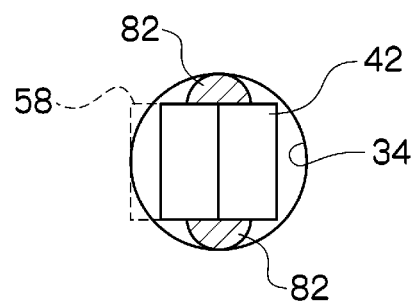

Returning to FIG. 3, the attaching portion 42 of the probe 52 of the above probe plate 50 is then inserted into the through hole 34 of the probe substrate 24 from the side of the leading portion 46 (step 202). The length dimension of the attaching portion 42 is slightly longer than the thickness dimension of the probe substrate 24. Accordingly, as shown in FIGS. 5, 16, and 17, when the attaching portion 42 is inserted until the step 58 abuts on the probe substrate 24, the attaching portion 42 makes the end portion on the side of the leading portion 46 slightly project from the probe substrate.

Abutment of the step 58 on the probe substrate 24 enables the attaching portion 42 of each probe 52 to be inserted into the through hole 34 easily so that the inserting lengths of the probes 52 in the through holes 34 may be equal to one another, and so that the projecting length of the attaching portion 42 from the probe substrate 24 may be equal to one another.

Figure 5:
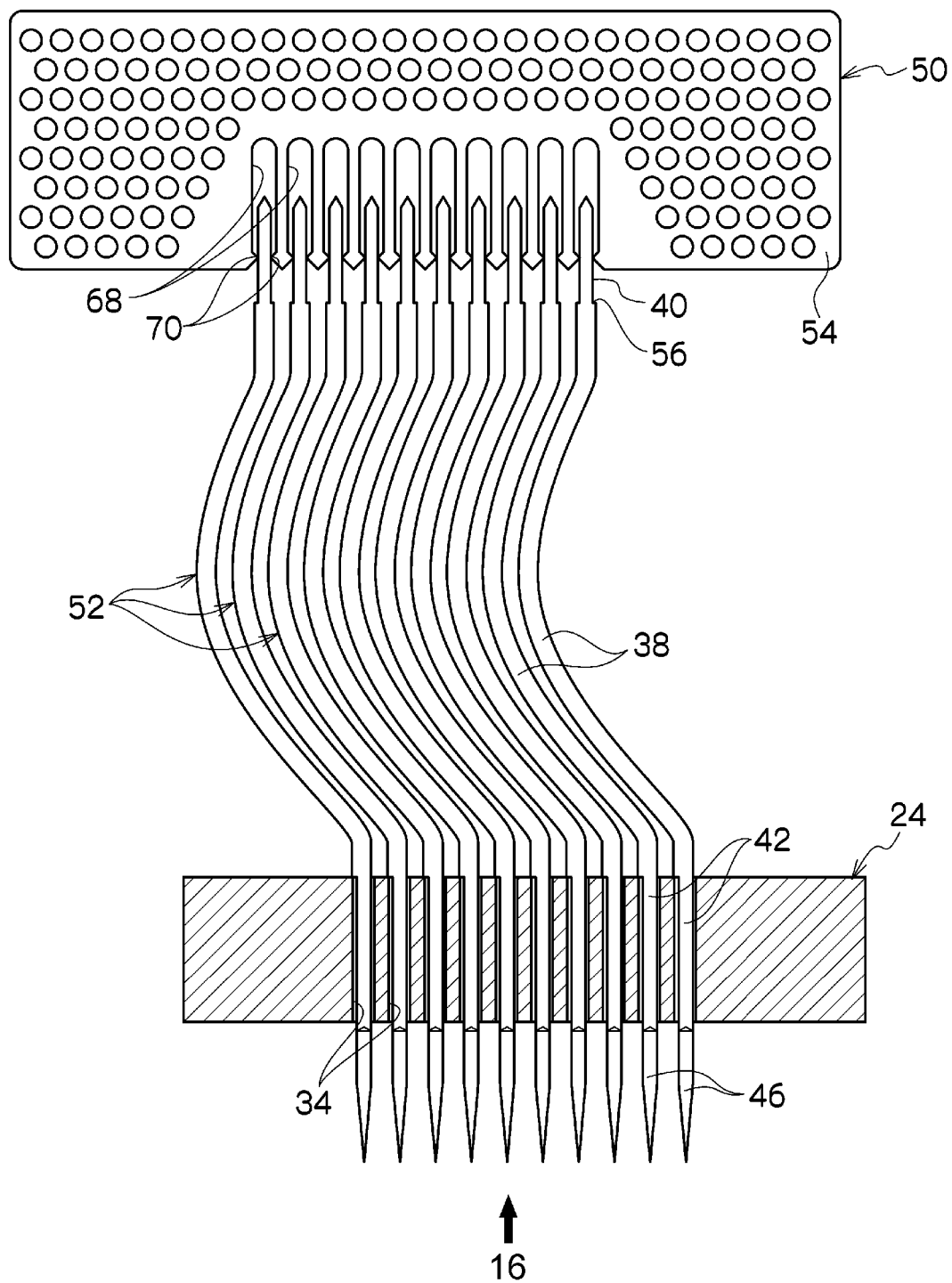
FIG. 5 shows a state in which attaching portions of probes coupled with the probe plate are inserted in through holes of the probe substrate.

Inserting the attaching portion 42 into the through hole 34 in a state where each probe 52 is upside down as shown in FIG. 5 facilitates the inserting operation of the attaching portion 42 into the through hole 34. Also, the fact that the dimension corresponding to dimension W1 at the lower area of the leading portion 46 is decreased toward on the upper end side facilitates the inserting operation of the attaching portion 42 into the through hole 34.

Subsequently, the probe substrate 24 and the probe plate 50 are heated, the material (jointing material) for the jointing material layer 64 is melted, and thereafter the molten material is solidified (step 203). Consequently, each probe 52 is fixed in the through hole 34 of the probe substrate 24.

As described above, the metal layer 62 is made of the material in which wettability of the liquefied material of the jointing material layer 64 to the metal layer 62 is higher than wettability of the jointing material layer 64 to the attaching portion 42. Accordingly, when the jointing material layer 64 covering the metal layer 62 as shown in FIG. 15 is melted at step 203, the molten material or the liquefied material is concentrated on the metal layer 62 by its own surface tension and is solidified in this state to become a jointing material 82 filling a gap between the outer circumferential surface of the attaching portion 42 and the inner surface forming the through hole 34 and jointing the probe 26 to the probe substrate 24, as shown in FIG. 17. As a result, each probe 52 is fixed to the probe substrate 24 at the attaching portion 42.

Figure 6:
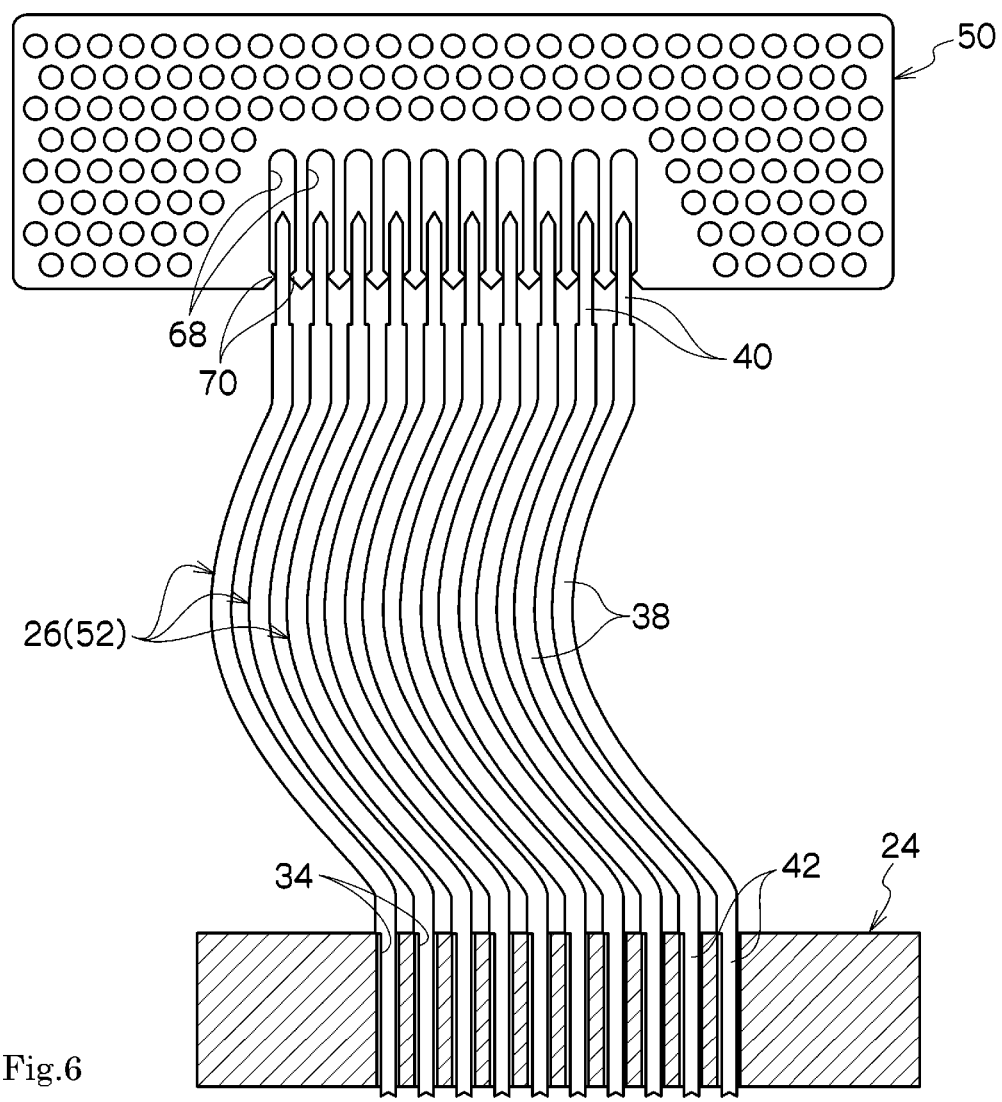
FIG. 6 shows a state in which a leading portion of each probe has been removed.

Subsequently, as shown in FIG. 6, the leading portion 46 is detached from each probe 52 with the tab, and each probe 52 is separated from the tab 54 at the probe tip portion 40 and the coupling portions 70 (step 204). By doing so, each probe 52 is converted into the probe 26 for the probe card 20, and a probe assembly is obtained.

Figure 20:
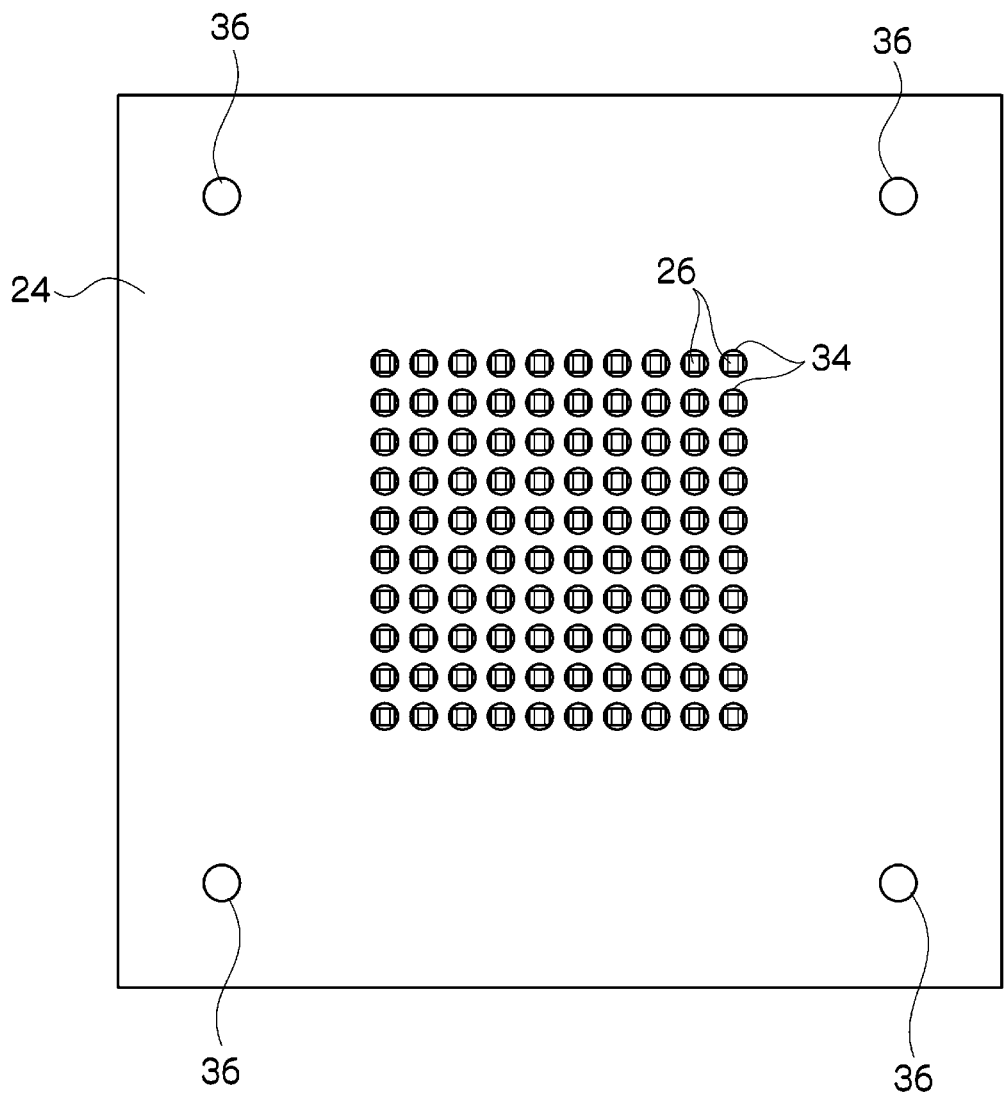
FIG. 20 is a plan view showing the probe substrate after the tab is removed.

The detaching operation of the leading portion 46 can be done easily by breaking the leading portion 46 from the attaching portion 42 since the dimension of the probe 52 is as small as several tens of to a hundred and several tens of microns. The obtained probe assembly is shown in FIG. 7, and the bottom view of FIG. 7 is shown in FIG. 20. By detachment of the leading portion 46, the opening 60 existing at the border between the attaching portion 42 and the leading portion 46 functions as a groove or a recess opened to a side opposite the probe main body portion 38 and having a V cross-sectional shape.

Figure 18:
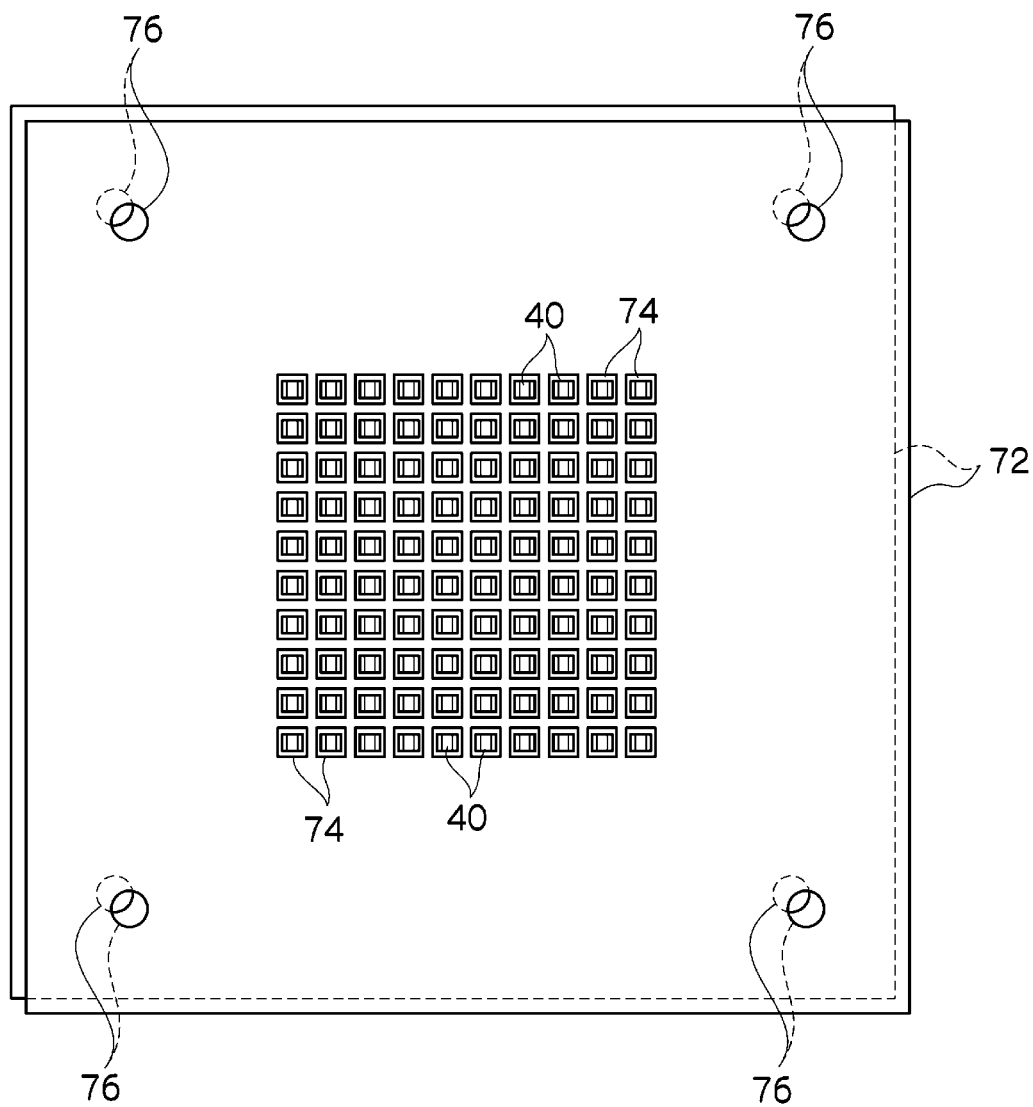
FIG. 18 is a plan view showing an embodiment of the positioning members.

Subsequently, three plate-like positioning members 72 manufactured in a separate process from the above are prepared (step 205). Each positioning member 72 is formed in a rectangular shape having the same size and has at the central area multiple rectangular through holes 74 penetrating in the thickness direction in plural rows and at the four corners through holes 76 respectively, as shown in FIG. 18.

Each positioning member 72 is made of a metal material or a resin material to prevent the through holes 76 from being deformed. The positioning member 72 can be manufactured by the photolithographic technique and the deposition technique.

Each of the through holes 74 of each positioning member 72 has a larger dimension than the rectangular cross-section of the probe tip portion 40, and the through holes 74 are provided in the positioning member 72 to have equal dimensions and equal distances to one another. Accordingly, the probe tip portions 40 are easily inserted into the three positioning members piled up in a state where the through holes 74 are aligned.

The through holes 76 of the respective positioning members 72 have equal dimensions to one another and are formed in the positioning members 72 so as to be aligned with one another in a case where the respective positioning members 72 are piled up in a state where each communicating part of the through holes 74 of the piled positioning members 72 is in an equal shape to the rectangular cross-section of the probe tip portion 40. Thus, in a state where the through holes 76 are aligned, the probe tip portion 40 inserted in each through hole 74 of the piled positioning members 72 is clamped by the three positioning members.

Figure 8:
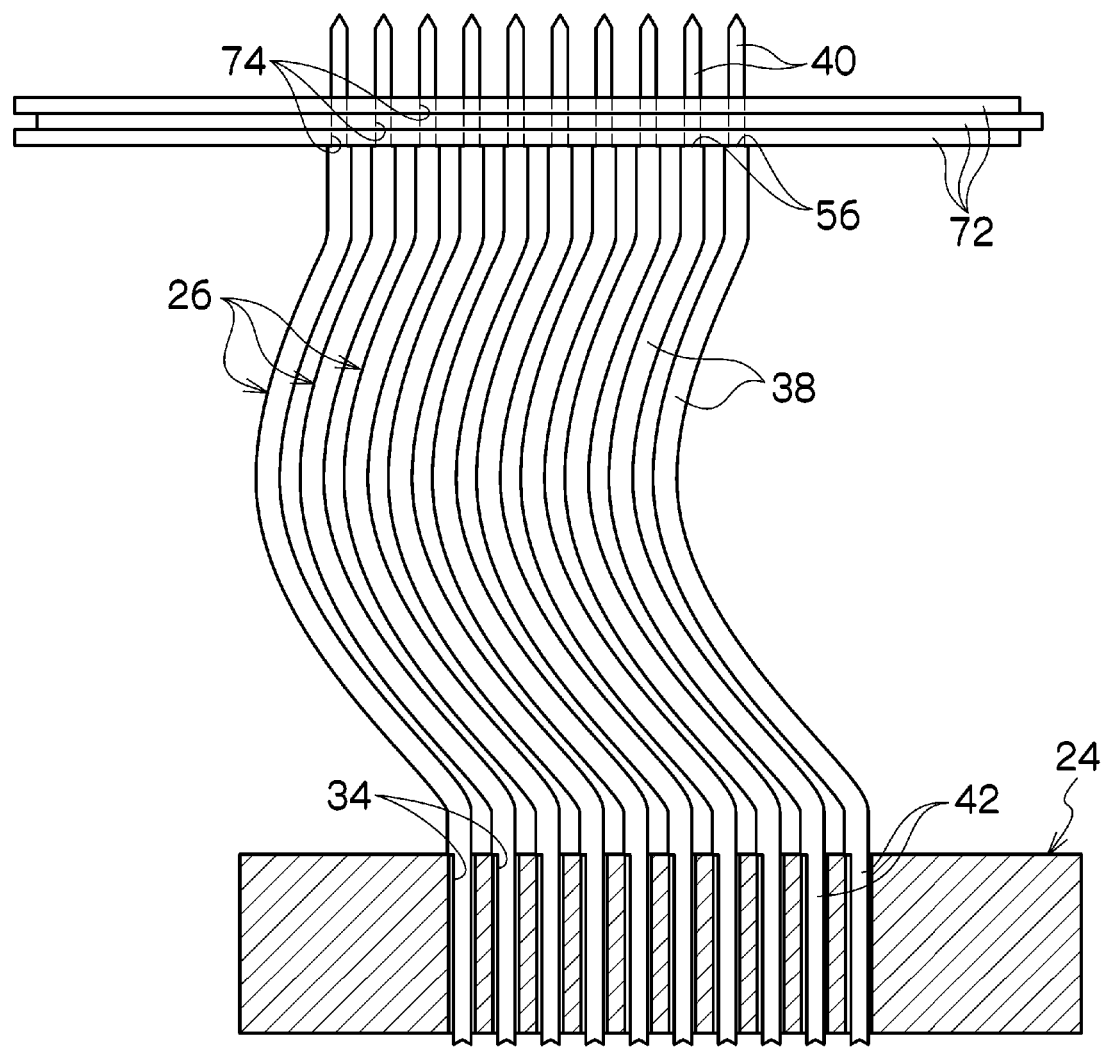
FIG. 8 shows a state in which two-dimensional relative positioning of probe tips is done by a plurality of positioning members.
Figure 9:
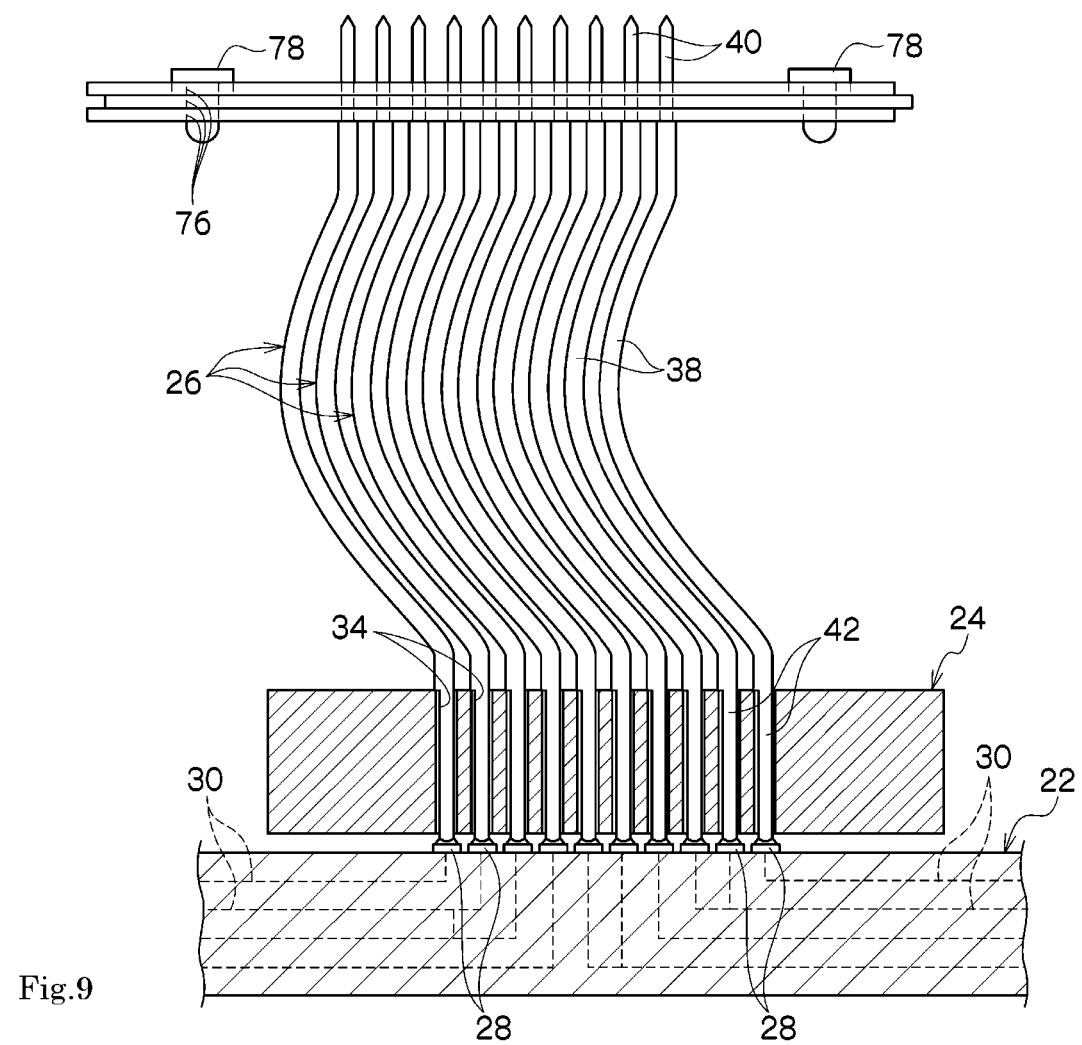
FIG. 9 shows a state in which a probe assembly is coupled with a wiring board.
Figure 19:
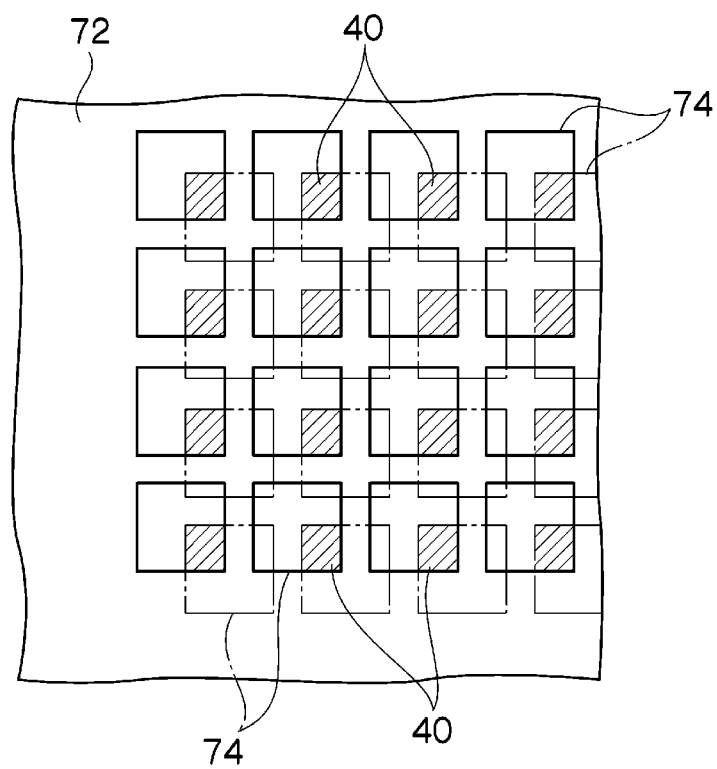
FIG. 19 illustrates mutual positioning of the probe tips.

Referring to FIG. 8, the probe tip portion 40 of each probe 26 is inserted in the respective through holes 74 of the three positioning members 72 piled in a state where the through holes 74 are aligned, and thereafter the positioning members 72 are moved in parallel to bring a state where the through holes 76 are aligned (refer to FIG. 19). Each check 78 is inserted in the aligned through holes 76 to temporarily joint the three positioning members 72 in the positional relationship (refer to FIG. 9). Accordingly, the probe tip portions 40 of the plural probes 26 are positioned to one another in the right-left direction and the front-back direction. Also, since the probe tip portion 40 of each probe 26 is inserted in the through hole 34 until the step 56 abuts on the positioning members 72, the probe tip portions 40 of the plural probes 26 are positioned to one another in the up-down direction.

At step 206, positioning is done with use of the positioning members 72 as above, as a result of which three-dimensional positioning of the probe tip portions 40 of the plural probes 26 can be done easily and accurately.

Subsequently, in a state where the relative position among the probe tip portions 40 is maintained by the three positioning members 72, two-dimensional positions of the probe tips 44 are tested and adjusted (step 207). Instead of using three positioning members 72, two or four or more positioning members 72 may be used.

Subsequently, a heat treatment of the jointing materials 82 of all probes 26 is conducted (step 208). In this heat treatment, the jointing materials 82 are heated approximately at a half temperature of a melting temperature of the jointing material 82 (for example, in a case of tin, 150° C. to 170° C.) for several hours (for example, 2 to 3 hours) and are thereafter cooled gradually.

Since the jointing material 82 of each probe 26 is softened to be deformable by the above heat treatment, the attaching portion 42 of each probe 26 can be displaced against the through hole 34 by deforming the softened jointing material 82. Consequently, due to the fact that the relative position among the probe tips 44 is maintained by the positioning members 72, a residual stress such as a strain existing in each probe 26 is eliminated, each probe 26 is held in the probe substrate 24 in a stable manner, and the relative positional relationship among the probe tips 44 of the probes 26 becomes stable.

At step 208, at least part of the jointing material 82 fixing the attaching portion 42 to the through hole 34 is also softened, but due to the wettability of the jointing material to the metal layer 62 and the surface tension of the jointing material, the molten or softened jointing material 82 returns to a state of filling a gap between the outer circumferential surface of the attaching portion 42 and the inner surface forming the through hole 34 after it is solidified.

Subsequently, the wiring board 22 manufactured in a separate process from the above and described above is prepared (step 209).

Subsequently, each probe 26 is fixed to the coupling portion 28 of the wiring board 22 at its end on the side of the attaching portion 42 (step 210). This operation is done by arranging the probe substrate 24 to one surface side of the wiring board 22 in a state where the end surface of each probe 26 on the side of the attaching portion 42 abuts on the coupling portion 28 of the wiring board 22 and melting in this state and thereafter solidifying the jointing material 82 existing at least at the end of the attaching portion 42.

At step 210, at least part of the jointing material 82 fixing the attaching portion 42 to the through hole 34 is also melted or softened, but due to the wettability of the jointing material to the metal layer 62 and the surface tension of the jointing material, the molten or softened jointing material 82 returns to a state of filling a gap between the outer circumferential surface of the attaching portion 42 and the inner surface forming the through hole 34 after it is solidified.

Thereafter, the positioning members 72 are detached from the probes 26 (step 211). This operation can be done by removing the checks 78 and then pulling out the respective positioning members 72 from the probe tip portions 40. However, without detaching the positioning members 72, that is, in a state of maintaining the two-dimensional positions of the probe tips 44 by the positioning members 72, the probe card may be used. In this case, the positioning members 72 are made of electrical insulating materials.

As a result of the above, the probe card 20 shown in FIG. 1 is completed. In the completed probe card 20, since the jointing material (not shown) jointing the attaching portion 42 to the coupling portion 28 exist in the opening or the recess 60 (refer to FIG. 14), the contact area of the jointing material to the attaching portion 42 is large, and the jointing strength between the attaching portion 42 and the coupling portion 28 is high.

The above steps can be changed arbitrarily.

For example, in the operations at step 203, the operation of melting and thereafter solidifying the material for the jointing material layer 64 to fix the attaching portion 42 in the through hole 34 may be done before or at step 211. Also, in the operations at 211, the operation of pulling out each positioning member 72 from the probe tip portions 40 may be done between step 208 and step 210. Also, in the operations at step 204, the operation of detaching the leading portion 46 from the attaching portion 42 may be done before step 203.

Figure 21:
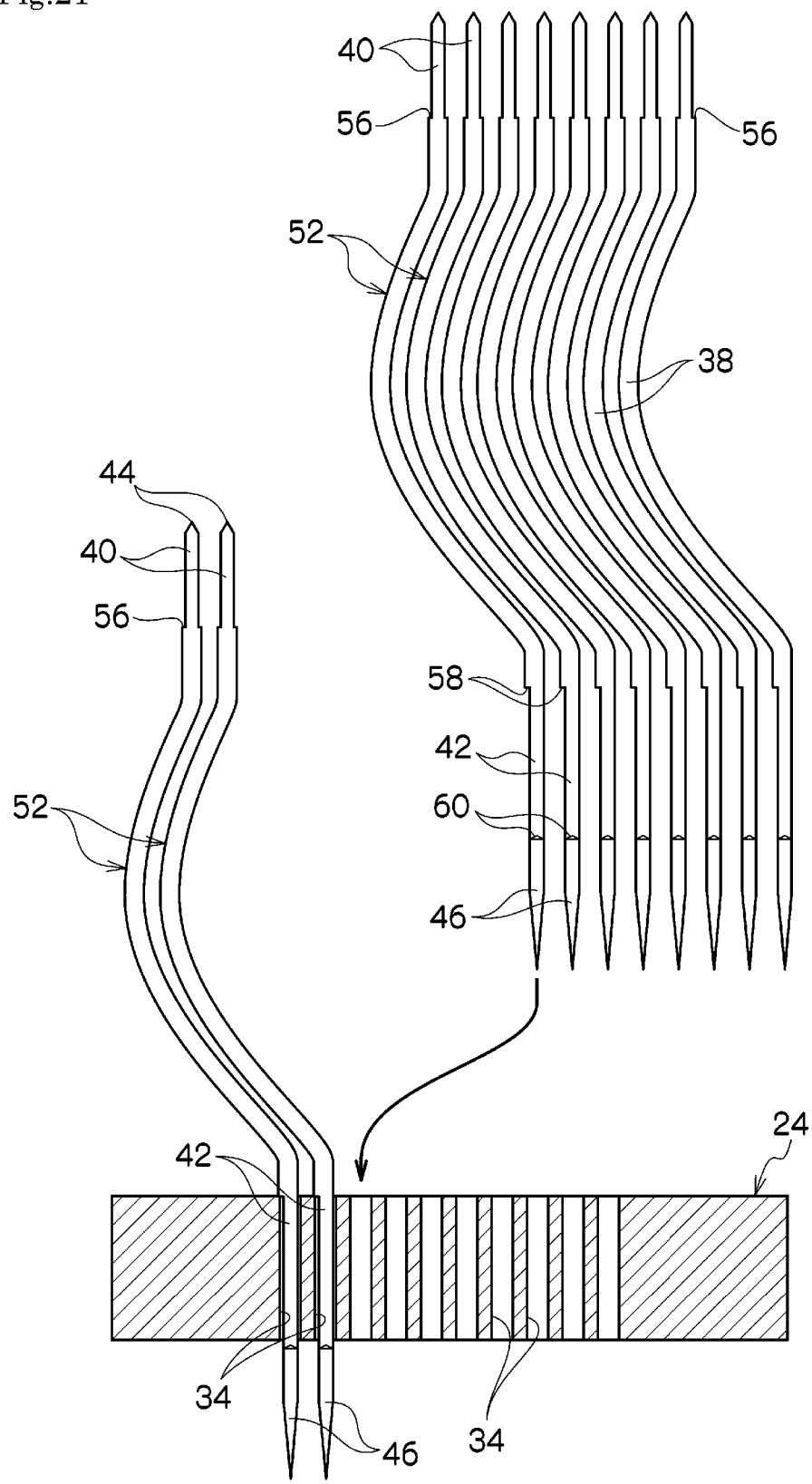
FIG. 21 illustrates another embodiment of the embodiment of the subject matter.

Instead of the plural probes 52 coupled with the plate-like tab 54, multiple respectively independent probes 52 may be used as shown in FIG. 21.

INDUSTRIAL APPLICABILITY

The embodiment of the subject matter is not limited to the above embodiments but may be altered in various ways without departing from the spirit and scope of the embodiment of the subject matter.

REFERENCE SIGNS LIST 20 probe card
22 wiring board
24 probe substrate
26 probe
28 coupling portion
30 internal wire
32 connecting portion
34, 36 through hole
38 probe main body portion
40 probe tip portion
42 attaching portion
44 probe tip 46 leading portion
50 probe plate
52 probe
54 tab
56, 58 step
60 opening (recess)
62 metal layer
64 jointing material layer
66 hole
68 recess
70 coupling portion
72 positioning member
74, 76 through hole
78 check
82 jointing material

What is claimed is:

1. A method for manufacturing a probe card, comprising:
preparing a plurality of probes, each probe having a probe tip portion and a columnar attaching portion, the columnar attaching portion having a circumferential surface;
forming, for each of the plurality of probes at a part of the circumferential surface, a metal layer having higher wettability than that of the attaching portion;
forming, for each of the plurality of probes, a layer of a hot-melt material to cover the metal layer and at least a part of the circumferential surface exposed from the metal layer;
preparing a probe substrate having a plurality of through holes penetrating in its thickness direction;
for each of the plurality of probes, inserting its attaching portion into a different one of the plurality of through holes of the probe substrate so that at least a part of its metal layer is located in the through hole in which the attaching portion is inserted;
melting the hot-melt material of each attaching portion; and
thereafter solidifying the hot-melt material in a state where the hot-melt material contacts the part of the metal layer and a part of a wall surface of the through hole to fix each probe to the probe substrate.

2. The method according to claim 1, wherein the attaching portion of each probe has a rectangular cross-sectional shape.

3. The method according to claim 1, wherein the step of preparing the plurality of probes includes manufacturing a probe plate, the probe plate having the plurality of probes and a tab integrally coupling the probes and detachable from each probe at the proximity of the probe tip portion of each probe,
the method further comprising, after solidifying the hot-melt material, separating the tab from each probe.

4. The method according to claim 1, wherein each probe has a leading portion extending upward from an upper end portion of the attaching portion, and
wherein inserting the attaching portion into the through hole includes inserting the attaching portion of each probe into the through hole from a side of the leading portion,
the method further comprising, after inserting the attaching portion of each of the plurality of probes into each of the plurality of through holes, removing the leading portion from the probe.

5. The method according to claim 1, wherein the plurality of through holes are arrayed in plural rows, and
wherein the step of preparing the plurality of probes includes manufacturing a plurality of probe plates, each probe plate having the plurality of probes and a tab collectively holding the probes and detachably coupled integrally with each probe at the proximity of the probe tip portion of each probe,
the method further comprising, after solidifying the hot-melt material, separating the tab from each probe.

6. The method according to claim 1, further comprising arranging the probe substrate on one surface of a wiring board and jointing upper end portions of the attaching portions to a plurality of coupling portions formed on the one surface of the wiring board.

7. The method according to claim 1, wherein each probe has a curved main body portion.

* * * * *